(12) United States Patent
Shi et al.

(10) Patent No.: US 11,566,531 B2
(45) Date of Patent: Jan. 31, 2023

(54) CMAS-RESISTANT ABRADABLE COATINGS (71) Applicants: Rolls-Royce Corporation, Indianapolis, IN (US); Rolls-Royce plc, London (GB)

(72) Inventors: Jun Shi, Carmel, IN (US); Matthew Eric Hancock, Denby (GB); Li Li, Carmel, IN (US)

(73) Assignees: Rolls-Royce Corporation, Indianapolis, IN (US); Rolls-Royce PLC, London (GB)

( * ) Notice: Subject to any disclaimer, the term of this patent is extended or adjusted under 35 U.S.C. 154(b) by 0 days.

(21) Appl. No.: 17/065,127

(22) Filed: Oct. 7, 2020

(65) Prior Publication Data
US 2022/0106888 A1 Apr. 7, 2022

(51) Int. Cl.
| | |
|---|---|
| *F01D 11/12* | (2006.01) |
| *C23C 4/11* | (2016.01) |
| *C23C 4/134* | (2016.01) |
| *B32B 18/00* | (2006.01) |
| *C23C 14/08* | (2006.01) |

(Continued)

(52) U.S. Cl.
CPC ............ *F01D 11/122* (2013.01); *B32B 18/00* (2013.01); *C23C 4/11* (2016.01); *C23C 4/134* (2016.01); *C23C 14/081* (2013.01); *F01D 5/20* (2013.01); *F01D 5/288* (2013.01); *B32B 2315/02* (2013.01); *F05D 2230/90* (2013.01); *F05D 2300/611* (2013.01)

(58) Field of Classification Search
CPC . F01D 5/28; F01D 5/282; F01D 5/284; F01D 5/286; F01D 5/288; F01D 11/08; F01D 11/12; F01D 11/122; F05D 2230/90; F05D 2230/611; B23B 18/00; B23B 2315/02; C23C 4/11; C23C 4/134; C23C 14/081
See application file for complete search history.

(56) References Cited

U.S. PATENT DOCUMENTS

| | | | |
|---|---|---|---|
| 4,269,903 | A | 5/1981 | Clingman et al. |
| 4,422,648 | A | 12/1983 | Eaton et al. |
| 4,503,130 | A | 3/1985 | Bosshart et al. |

(Continued)

FOREIGN PATENT DOCUMENTS

| | | | |
|---|---|---|---|
| EP | 1642993 B1 | 11/2012 | |
| EP | 2540973 A1 * | 1/2013 | ............. C23C 28/30 |

(Continued)

OTHER PUBLICATIONS

Schlegel, N et al. "Columnar-Structured Mg—Al-Spinel Thermal Barrier Coatings (TBCs) by Suspension Plasma Spraying (SPS)." Journal of thermal spray technology 24.1-2 (2014): 144-151. Web. (Year: 2014).*

(Continued)

*Primary Examiner* — Brian P Wolcott
(74) *Attorney, Agent, or Firm* — Shumaker & Sieffert, P.A.

(57) ABSTRACT

In one example, an article including a metallic substrate; and an abradable coating on the metallic substrate, the abradable coating including a plurality of abradable layers in an alternating arrangement with a plurality of CMAS resistant layers, wherein the plurality of CMAS resistant layers are configured to react with molten CMAS to form a stable phase.

10 Claims, 4 Drawing Sheets (51) Int. Cl.
*F01D 5/20* (2006.01)
*F01D 5/28* (2006.01)

(56) References Cited

U.S. PATENT DOCUMENTS

| | | | |
|---|---|---|---|
| 6,358,002 B1 | 3/2002 | Good et al. | |
| 8,124,252 B2 * | 2/2012 | Cybulsky | C23C 30/00 |
| | | | 428/701 |
| 8,172,519 B2 | 5/2012 | Jarrabet et al. | |
| 8,470,460 B2 * | 6/2013 | Lee | C04B 41/89 |
| | | | 428/471 |
| 8,658,255 B2 * | 2/2014 | Kirby | C23C 28/042 |
| | | | 427/255.18 |
| 9,194,242 B2 * | 11/2015 | Lee | F01D 5/288 |
| 9,713,912 B2 * | 7/2017 | Lee | C23C 28/048 |
| 10,233,760 B2 * | 3/2019 | Lee | C23C 30/00 |
| 10,808,565 B2 | 10/2020 | Walston et al. | |
| 10,871,078 B2 * | 12/2020 | Ndamka | C23C 28/044 |
| 2003/0138658 A1 | 7/2003 | Taylor et al. | |
| 2009/0324930 A1 | 12/2009 | Tulyani et al. | |
| 2010/0159151 A1 | 6/2010 | Kirby et al. | |
| 2013/0122259 A1 | 5/2013 | Lee | |
| 2013/0189531 A1 * | 7/2013 | Lee | C04B 41/89 |
| | | | 428/448 |
| 2013/0260132 A1 * | 10/2013 | Hazel | C23C 28/347 |
| | | | 427/454 |
| 2014/0199163 A1 * | 7/2014 | Lee | C23C 4/11 |
| | | | 415/174.4 |
| 2016/0003092 A1 | 1/2016 | Chamberlain et al. | |
| 2017/0183782 A1 | 6/2017 | Kirby | |
| 2017/0314410 A1 | 11/2017 | Liu et al. | |
| 2018/0010469 A1 | 1/2018 | Kadau et al. | |
| 2018/0282851 A1 | 10/2018 | Ndamka et al. | |
| 2019/0032504 A1 | 1/2019 | Shi et al. | |
| 2019/0048475 A1 * | 2/2019 | Ndamka | C23C 28/321 |
| 2019/0092701 A1 | 3/2019 | Gong et al. | |
| 2019/0093497 A1 | 3/2019 | Ndamka et al. | |
| 2019/0330121 A1 * | 10/2019 | Pin | C04B 41/89 |
| 2020/0277871 A1 | 3/2020 | Shi et al. | |
| 2020/0123071 A1 * | 4/2020 | Ndamka | C04B 41/87 |
| 2021/0188721 A1 * | 6/2021 | Shi | F01D 25/005 |
| 2021/0396150 A1 * | 12/2021 | Golden | F01D 5/284 |

FOREIGN PATENT DOCUMENTS

| | | | | |
|---|---|---|---|---|
| EP | 3162783 A1 | 5/2017 | | |
| EP | 3178799 A1 | 6/2017 | | |
| EP | 3640360 A1 | 4/2020 | | |
| FR | 2979664 A1 * | 3/2013 | | F01D 11/122 |

OTHER PUBLICATIONS

U.S. Appl. No. 17/126,807, filed Dec. 18, 2020, by Shi et al.
Extended Search Report from counterpart European Application No. 21199591.5 dated Feb. 22, 2022, 9 pp.
Office Action from U.S. Appl. No. 17/126,807 dated Jul. 1, 2022, 12 pp.
Response to Extended Search Report dated Feb. 22, 2022, from counterpart European Application No. 21199591.5 filed Oct. 10, 2022, 9 pp.
Response to Office Action dated Jul. 1, 2022, from counterpart U.S. Appl. No. 17/126,807, filed Oct. 3, 2022, 8 pp.

* cited by examiner

CMAS-RESISTANT ABRADABLE COATINGS

TECHNICAL FIELD

The disclosure relates to coatings on metallic substrates for high-temperature mechanical systems, such as gas turbine engines, and techniques for forming the same.

BACKGROUND

The components of gas turbine engines operate in severe environments. For example, the high-pressure turbine airfoils exposed to hot gases in commercial aeronautical engines typically experience surface temperatures of about 1000° C. Components of high-temperature mechanical systems may include a superalloy substrate or other type metallic substrate. In many examples, the substrates may be coated with one or more coatings to modify properties of the surface of the substrate. For example, metallic substrates may be coated with a thermal barrier coating to reduce heat transfer from the external environment to the substrate, and/or an environmental barrier coating to reduce exposure of the substrate to environmental species, such as oxygen, water vapor, or Calcia-Magnesia-Alumina Silicate (CMAS) containing materials, and/or an abradable coating to improve a seal.

SUMMARY

In general, the present disclosure describes example articles including CMAS resistant abradable coating systems on metallic substrates, such as superalloy substrates, and techniques and systems for manufacturing the same. The CMAS resistant abradable coating systems may including a plurality of abradable layers in an alternating arrangement with a plurality of CMAS resistant layers. In various examples, the layered CMAS resistant abradable coatings may allow for a component defining a seal segment in a gas turbine engine that exhibits a relatively high level of CMAS resistance at varying blade cut depths, while also abrading in a manner that allows for a beneficial seal for the component relative to the tip of an opposing part to enhance the power and efficiency of the gas turbine engine.

In one aspect, the present disclosure is directed to an article including a metallic substrate; and an abradable coating on the metallic substrate, the abradable coating comprising a plurality of abradable layers in an alternating arrangement with a plurality of CMAS resistant layers, wherein the plurality of CMAS resistant layers are configured to react with molten CMAS to form a stable phase.

In another aspect, the present disclosure is directed to an abradable system including a metallic substrate; an abradable coating on the metallic substrate, the abradable coating comprising a plurality of abradable layers in an alternating arrangement with a plurality of CMAS resistant layers, wherein the plurality of CMAS resistant layers are configured to react with molten CMAS to form a stable phase; and an opposing abrasive element acting on the abradable coating.

In another aspect, the present disclosure is directed to a method comprising forming an abradable coting on a metallic substrate, the abradable coating comprising a plurality of abradable layers in an alternating arrangement with a plurality of CMAS resistant layers, wherein the plurality of CMAS resistant layers are configured to react with molten CMAS to form a stable phase.

The details of one or more examples are set forth in the accompanying drawings and the description below. Other features, objects, and advantages will be apparent from the description and drawings, and from the claims.

BRIEF DESCRIPTION OF DRAWINGS

Like symbols in the drawings indicate like elements.

DETAILED DESCRIPTION

In the context of gas turbine engines, increasing demands for greater operating efficiency (e.g., fuel efficiency) has led to the operation of gas turbine engines at higher temperatures. In some examples, substrates, such as metallic substrates, of high-temperature mechanical systems are coated with a TBC system to provide thermal protection as well as environmental protection, in some instances, for the underlying substrate material(s) in a high temperature environment. In some examples, the topcoat for a TBC system may include a Yttria-stabilized zirconia (YSZ)-based TBC composition (e.g. 7YSZ) for vane and blade components of an engine and a YSZ-based TBC composition with a Mg-Spinel abradable coating for seal segments. The YSZ-based TBC composition may be applied via electron beam-physical vapor deposition (EB-PVD) or air plasma spraying (APS) while the Mg-Spinel may be applied via APS.

However, such coatings may be deleteriously attacked from CMAS due to the higher operating conditions of the engine and flying in regions with greater concentrations of CMAS on the ground and in the air. For example, increased operating temperatures, may lead to increased damage due to the presence of CMAS deposits within the high temperature environments. The presence of CMAS deposits in the high temperature environments of a gas turbine engine may result from the ingestion of siliceous minerals (e.g., airborne dust, sand, volcanic dust and ashes, fly ash, runway debris, concrete dust, fuel residue, and the like) in the intake gas drawn through the gas turbine engine. For example, when siliceous debris such as sand and dust is ingested into the engine, it can melt and deposit on coated hot section components (e.g. seal segments, vanes and blades). These partial or fully molten deposits are commonly referred to as calcium magnesium aluminosilicates ("CMAS") because the primary oxide constituents are CaO, MgO, $Al_2O_3$ and $SiO_2$. Once molten CMAS has deposited on the surface of TBCs and/or abradable coatings, the CMAS may dissolve, react and/or infiltrate the coating system which leads to coating recession and/or spallation. Therefore, it may be preferable that coating systems including TBC and/or abradable coatings possess sufficient CMAS resistance to meet coating life requirements.

For gas turbine seal segments, it is desirable to have a layer of abradable coating, such as a Mg-Spinel that turbine blade tips cut into during operation. Due to airborne CMAS, the abradable coating should also have high CMAS resistance. It has been found that certain materials such as gadolinium zirconate (GdZO), higher yttria stabilized zirconia (e.g., greater than 8 wt % yttria), and yttrium aluminate garnets (YAG) may have relatively high CMAS resistance and, thus, it may be preferable to have one or more layers of such materials on the flow side path of an abradable coating. GdZO or other CMAS tolerant coatings may, however, have a relatively low fracture toughness, thereby making such coatings ideal for an abradable coating material.

Due to manufacturing tolerances and relative thermal/mechanical deformation of the blades and seal segments, the blade tip cut depth can vary from one seal segment to another, and from one turbine engine to another. For example, the designed nominal blade cut-depth can be 0.2 mm, but the deepest blade cut-depth could be as high as 0.4 mm. Under such cut conditions, it may be desirable to have a CMAS resistant abradable coating that can accommodate a variable cut depth.

In accordance with examples of the disclosure, a CMAS resistant abradable coating system including a is described. The CMAS resistant abradable coating may be applied on a metallic substrate, e.g., a super alloy substrate. The CMAS resistant abradable coating systems may including a plurality of abradable layers in an alternating arrangement with a plurality of CMAS resistant layers. In various examples, the layered CMAS resistant abradable coatings may allow for a component defining a seal segment in a gas turbine engine that exhibits a relatively high level of CMAS resistance at varying blade cut depths, while also abrading in a manner that allows for a beneficial seal for the component relative to the tip of an opposing part to enhance the power and efficiency of the gas turbine engine.

In some examples, the abradable coating systems according to the present disclosure may allow high-temperature components having metallic substrates, such as metallic substrate-based seal segments, to more safely operate in relatively higher temperature, steamy, or dusty environments, and may provide better coating strength, better resistance to oxidation, water vapor, and CMAS attack, or combinations thereof. In addition to the CMAS resistance, the coating system may also be abradable, e.g., by an opposing blade tip that rotates during operation, to provide a seal in the seal segment to enhance the power and efficiency of the gas turbine engine.

The abradable layers of the coating system may be configured to abrade in the manner described herein but may have relatively low CMAS resistance (e.g., as a result of the layers exhibiting a relatively high porosity or other void volume. Conversely, in some examples, the CMAS resistant layers of the coating system may react with CMAS to form stable products that slow the reaction/infiltration/penetration rate of CMAS. Additionally, or alternatively, the multiple interfaces formed between the alternating layers may prevent or slow down the propagation of thermal shock cracks (e.g., that originate at the interface of the coating system and underlying substrate) through the coating system, to eliminate or reduce pathways through the coating that CMAS may infiltrate. Thus, the coating system may resist or arrest CMAS infiltration through the coating system and restrict CMAS effects to only an outer region of the coating system, thus more effectively protecting the underlying metallic substrate.

Figure 1:
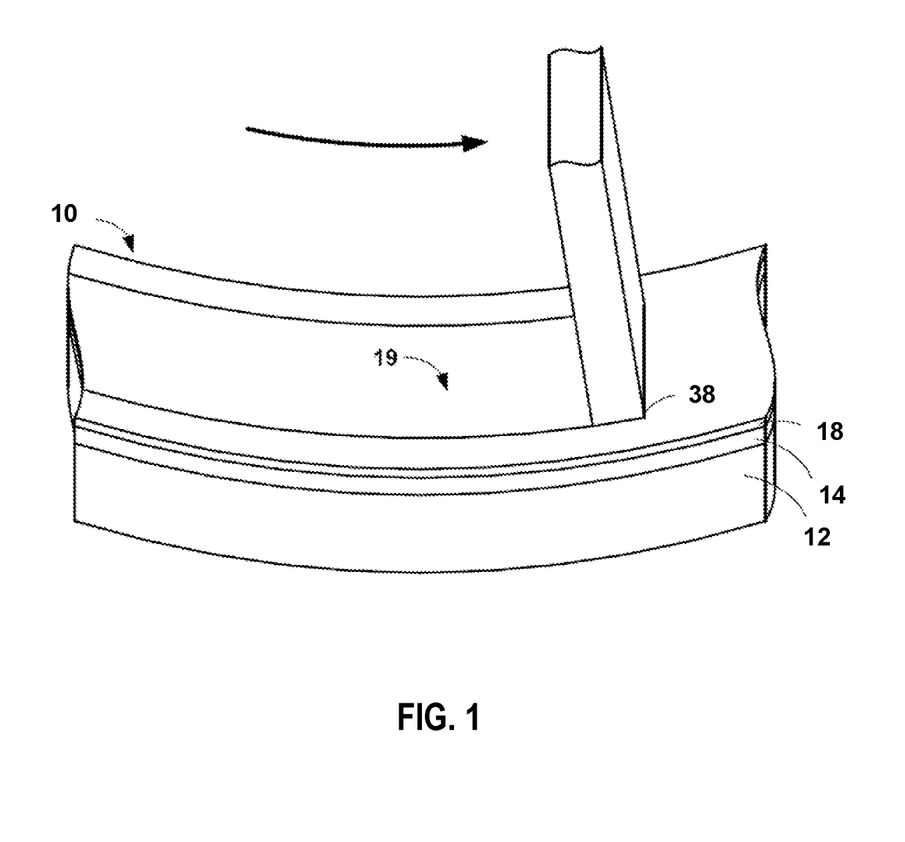
FIG. 1 is a schematic diagram illustrating an example article including a CMAS resistant abradable coating system.

FIG. 1 illustrates a perspective diagram of an example article 10 that may be used in a high-temperature mechanical system. As described above, article 10 includes a substrate 12, optional bond coat 14 deposited on substrate 12, and CMAS resistant abradable coating 18 deposited on bond coat 14 and substrate 12. The respective individual discrete layers of CMAS resistant abradable coating 18 are not shown in FIG. 1.

Article 10 may be a high-temperature component, for example, an industrial, automotive, or aeronautical component. In some examples, article 10 may be a component of a high-temperature mechanical system, such as, for example, a gas turbine engine or the like. In some examples, article 10 may form a portion of a flow path structure, a seal segment, a blade track, blade shroud, an airfoil, a blade, a vane, a combustion chamber liner, or another portion of a gas turbine engine article 10. While the description herein may be directed to a gas turbine blade track or shroud, it will be understood that the disclosure is not limited to such examples. Rather, CMAS resistant abradable coating 18 may be deposited over any article which requires or may benefit from an abradable coating with a relatively high level of CMAS resistance. For example, coating system 18 may be deposited on a cylinder of an internal combustion engine, an industrial pump, a housing or internal seal ring of an air compressor, or an electric power turbine.

While operating article 10 in high-temperature environments, a rotating component (e.g., blade tip 38) may abrade coating system 18 to cut track 19 in coating system 18. The thickness of coating system 18 may be selected such that track 19 does not penetrate all the way through coating system 18 into bond coat 14 and/or substrate 12. In the case of a turbine, as the turbine blade rotates, tip 38 of the turbine blade contacts coating system 18 and wears away a portion of coating system 18 to form track 19 in the coating system corresponding to the path of the turbine blade. The intimate fit between the blade tip and coating system 18 provides a seal that can reduce the clearance gap between the rotating component and an inner wall of the track or shroud, which can reduce leakage around a tip of the rotating part to enhance the power and efficiency of the gas turbine engine.

Figure 2:
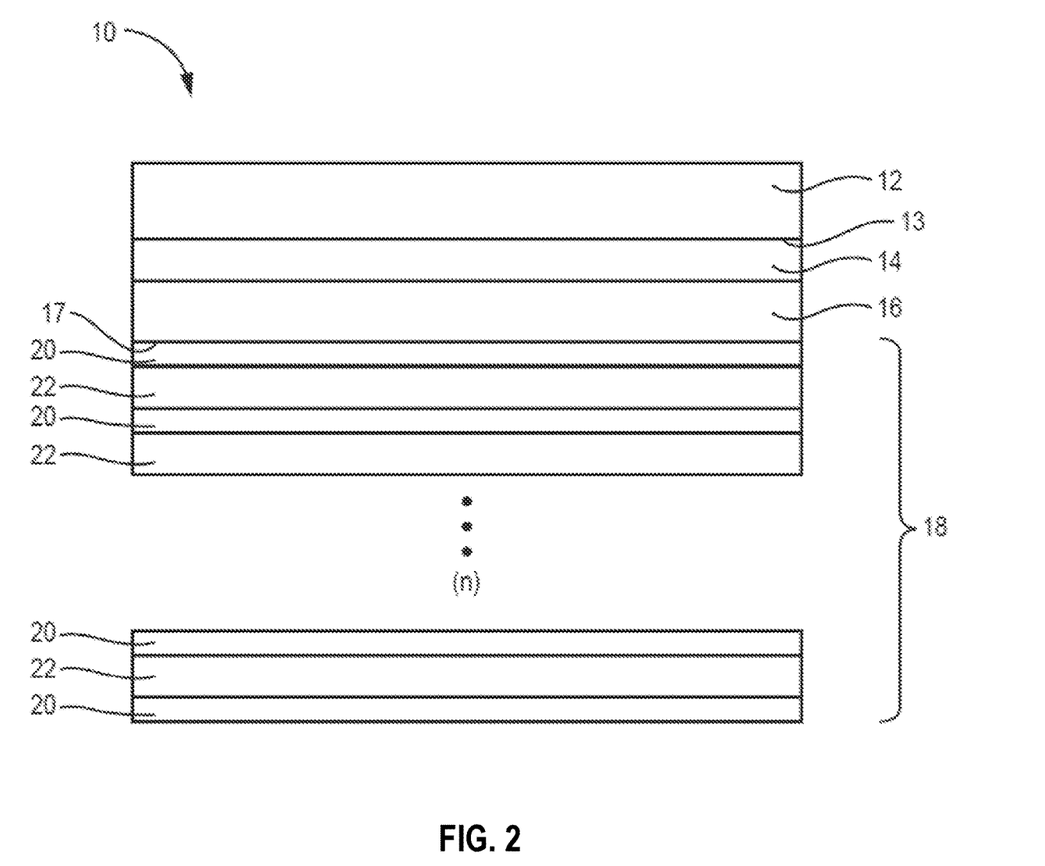
FIG. 2 is a schematic diagram of another example article including a CMAS resistant abradable coating system, which illustrates a cut formed by abrasion of the coating system by an opposing rotating element.

FIG. 2 is a conceptual cross-sectional view of article 10 including a substrate 12. Substrate 12 may be a metallic substrate such as a superalloy substrate. As shown, article 10 may include an optional bond coat 14, optional thermal barrier coating layer 16, and CMAS resistant abradable coating 18 on substrate 12.

Substrate 12 may include a material suitable for use in a high-temperature environment. In some examples, substrate 12 includes a superalloy including, for example, an alloy based on Ni, Co, Ni/Fe, or the like. In examples in which substrate 12 includes a superalloy material, substrate 12 may also include one or more additives such as titanium (Ti), cobalt (Co), or aluminum (Al), which may improve the mechanical properties of substrate 12 including, for example, toughness, hardness, temperature stability, corrosion resistance, oxidation resistance, or the like.

In the example of FIG. 2, an optional bond coating 14 is formed on all or a part of a surface 13 of substrate 12, e.g., to promote adherence or retention of overlaying layers on the substrate 12 (e.g., optional TBC layer 16 and/or coating system 18. As used herein, "formed on" and "on" mean a layer or coating that is formed on top of another layer or coating, and encompasses both a first layer or coating formed immediately adjacent a second layer or coating and a first layer or coating formed on top of a second layer or coating with one or more intermediate layers or coatings present between the first and second layers or coatings. In contrast, "formed directly on" and "directly on" denote a layer or coating that is formed immediately adjacent another layer or coating, e.g., there are no intermediate layers or coatings.

In some examples, as shown in FIG. 2, bond coat 14 may be directly on the substrate 12. In other examples, one or more coatings or layers of coatings may be between bond coat 14 and substrate 12.

Bond coat 14 may be between optional TBC layer 16/CMAS resistant abradable coating system 18 and substrate 12, and may increase the adhesion of optional TBC layer 16/CMAS resistant abradable coating system 18 to substrate 12. Bond coat 14 may be in direct contact with substrate 12 and TBC layer 16. In cases in which optional TBC layer 16 is not present, bond coat 14 may be in direct contact with CMAS resistant abradable coating system 18. In some examples, bond coat 14 has a thickness of approximately 25 microns to approximately 250 microns, although other thicknesses are contemplated.

Bond coat 14 may include any suitable material configured to improve adhesion between substrate 12 and TBC layer 16/CMAS resistant abradable coating system 18. In some examples, bond coat 14 may include an alloy, such as an MCrAlY alloy (where M is Ni, Co, or NiCo), a β-NiAl nickel aluminide alloy (either unmodified or modified by Pt, Cr, Hf, Zr, Y, Si, and combinations thereof), a γ-Ni+γ'—Ni$_3$Al nickel aluminide alloy (either unmodified or modified by Pt, Cr, Hf, Zr, Y, Si, and combination thereof), or the like. The composition of bond coat 14 may be selected based on the chemical composition and/or phase constitution of substrate 12 and the overlying layer (e.g., TBC layer 16/CMAS resistant abradable coating system 18 of FIG. 2). For example, if substrate 12 includes a superalloy with a γ-Ni+γ'—Ni$_3$Al phase constitution, bond coat 14 may include a γ-Ni+γ'—Ni$_3$Al phase constitution to better match the coefficient of thermal expansion of the superalloy substrate 12. In turn, the mechanical stability (e.g., adhesion) of bond coat 14 to substrate 12 may be increased.

In some cases, bond coat 14 may include a single layer or multiple layers having substantially the same or different compositions. In some examples, bond coat 14 includes multiple layers to provide multiple functions of bond coat 14, such as, for example, adhesion of substrate 12 to an overlying layer (e.g., TBC layer 16/CMAS resistant abradable coating system 18 of FIG. 2), chemical compatibility of bond coat 14 with each of substrate 12 and the overlying layer, a better coefficient of thermal expansion match of adjacent layers, or the like.

Bond coat 14 may be applied on substrate 12 using, for example, thermal spraying, e.g., air plasma spraying, high velocity oxy-fuel (HVOF) spraying, low vapor plasma spraying, suspension plasma spraying; physical vapor deposition (PVD), e.g., electron beam physical vapor deposition (EB-PVD), directed vapor deposition (DVD), cathodic arc deposition; chemical vapor deposition (CVD); slurry process deposition; sol-gel process deposition; electrophoretic deposition; or the like.

As shown in FIG. 2, article 10 may include optional thermal barrier coating (TBC) layer 16 on the optional bond coating 14, or on all or a portion of the surface 13 of the substrate 12. TBC layer 16 may provide thermal cycling resistance, a low thermal conductivity, erosion resistance, combinations thereof, or the like. In some examples, TBC layer 16 may include zirconia or hafnia stabilized with one or more metal oxides, such as one or more rare earth oxides, alumina, silica, titania, alkali metal oxides, alkali earth metal oxides, or the like. For example, TBC layer 16 may include yttria-stabilized zirconia (ZrO$_2$) or yttria-stabilized hafnia, or zirconia or hafnia mixed with an oxide of one or more of lutetium (Lu), ytterbium (Yb), thulium (Tm), erbium (Er), holmium (Ho), dysprosium (Dy), gadolinium (Gd), terbium (Tb), europium (Eu), samarium (Sm), promethium (Pm), neodymium (Nd), praseodymium (Pr), cerium (Ce), lanthanum (La), yttrium (Y), or scandium (Sc).

As one example, TBC layer 16 may include a rare earth oxide-stabilized zirconia or hafnia layer including a base oxide of zirconia or hafnia and at least one rare-earth oxide, such as, for example, at least one oxide of lutetium (Lu), ytterbium (Yb), thulium (Tm), erbium (Er), holmium (Ho), dysprosium (Dy), gadolinium (Gd), terbium (Tb), europium (Eu), samarium (Sm), promethium (Pm), neodymium (Nd), praseodymium (Pr), cerium (Ce), lanthanum (La), yttrium (Y), or scandium (Sc). In some such examples, TBC layer 16 may include predominately (e.g., the main component or a majority) the base oxide including zirconia or hafnia mixed with a minority amount of the at least one rare-earth oxide. In one example, TBC layer 16 may have a composition substantially the same or similar to that described below for abradable layers 22.

TBC layer 16 may have any suitable thickness. While TBC layer 16 is shown at a single layer, in other examples, article 10 may include multiple TBC layers having the same or different compositions.

Article 10 include CMAS resistant abradable coating system 18. In the example of FIG. 2, coating system 18 is on a surface 17 of TBC layer 16. In other examples, coating system 18 may be on bond coat 14 or directly on surface 13 of substrate 12.

In one example, coating system 18 may be on a flowpath surface above the moving metal blade tips in a turbine engine can reduce over tip leakage and improve efficiencies. For example, as described above, a rotating part may abrade a portion of a fixed abradable coating applied on an adjacent stationary part to form a seal having a very close tolerance. In an example, which is not intended to be limiting, abradable coatings are used in aircraft jet engines in the compressor and turbine sections where a minimal clearance is needed between the blade tips and a casing. For example, an abradable coating can be used to minimize the clearance between blade tips and an inner wall of an opposed track or shroud, which can reduce leakage or guide leakage flow of a working fluid, such as steam or air, across the blade tips, and thereby enhance turbine efficiency.

CMAS resistant abradable coating system 18 includes a plurality of CMAS resistant layers 20 in an alternating arrangement with a plurality of abradable layers 22. For example, as shown in FIG. 2, coating system 18 includes a repeating pattern of a single discrete CMAS resistant layer and single discrete abradable layer 22 with a CMAS resistant layer 20 being nearest substrate 12 and also another CMAS resistant layer 20 forming the topcoat of coating system 18. In other examples, an abradable layer 22 may be nearest substrate 12 and/or may form the topcoat of coating system 18. In some examples, coating system 18 may include at least two abradable layers 22 and at least two CMAS resistant layers 20. The total number of layers of coating system 18 may be from four layers to 20 layers, such as 8 layers to 16 layers. In the example of FIG. 2, CMAS resistant layers 20 and abradable layers 22 are directly on each other in the alternating arrangement, e.g., rather than having another intervening layer in between a respective CMAS resistant layer 20 and a respective abradable layer 22 at one or more locations in the alternating layer stack.

Each of plurality of abradable layers 22 may be configured to abrade, e.g., when brought into contact with an opposing surface such as a blade tip 38 (FIG. 1). In some examples, abradable layers 22 may have a different composition, microstructure and/or porosity compared to that of CMAS resistant layers 20 so that abradable layers 22 are more abradable than CMAS resistant layers 20 but less CMAS resistant than CMAS resistant layers 20. For example, one or more (e.g., substantially all) of abradable layers 22 may have a greater porosity or other void volume than one or more (e.g., substantially all) CMAS resistant layers 20. The greater porosity or other void volume of abradable layers 22 may result in abradable layers 22 being more abradable than CMAS resistant layers 20 but less resistant to CMAS infiltration through layers 22 compared to layers 20. As another example, one or more (e.g., substantially all) of abradable layers 22 may have a composition that is different than the composition of one or more (e.g., substantially all) of CMAS resistant layers 20, where the composition of CMAS resistant layers 20 is configured to react with molten CMAS to form a stable phase while the composition of abradable layers 22 does not react in such a manner.

Abradable layers 22 may have any suitable composition. In some example, abradable layers 22 may comprise, consist or consist essentially of a magnesium (Mg)-spinel ($MgAl_2O_4$). A non-stochiometric spinel may be employed, such as, a spinel with about 77 wt % alumina and about 22 wt % magnesia, for abradable layer 22. Other example compositions may include a zirconia/rare earth mixture, alumina, ytterbium and/or other ceramic material. Each respective layer of the plurality of abradable layers 22 in the alternating arrangement may have the same or substantially similar composition or, in other examples, the composition of one or more the respective layers 22 may be different than the composition of other respective layers 22 that make up the total number of abradable layers 22.

Abradable layers 22 may have any suitable microstructure. In some examples, abradable layer 22 may be relatively porous, e.g., with a porosity of about 15% or greater or a fugitive phase of about 15% or greater when formed and that is subsequently burned off. Example fugitive materials may include polyester, HBn, or the like. Each respective layer of the plurality of abradable layers 22 in the alternating arrangement may have the same microstructure or, in other examples, the microstructure of one or more the respective layers 22 may be different than the microstructure of other respective layers 22 that make up the total number of abradable layers 22.

Abradable layers 22 may have any suitable porosity or other void volume. The porosity or other void volume may allow for abradable layers 22 to be abraded in the manner described herein. As described above, in some examples, the porosity or other void volume of abradable layers 22 may be greater than CMAS resistant layers 20. Abradable layers 22 may include a porosity of, e.g., greater than about 8 volume percent (vol. %), such as about 8 vol. % to about 50 vol. % or about 10 vol. % to about 30 vol. %, where porosity is measured as a percentage of pore volume divided by total volume of abradable layers 22 (either on a individual layer basis or overall layer basis). In each case, the porosity of layers 22 may be measured using mercury porosimetry, optical microscopy or Archimedean method. In some examples, abradable layers 22 may include a void volume of, e.g., greater than about 8 volume percent (vol. %), such as about 8 vol. % to about 50 vol. % or about 10 vol. % to about 30 vol. %, where the void volume is the volume of void space over total volume. Each respective layer of the plurality of abradable layers 22 in the alternating arrangement may have the same or substantially similar void volume or, in other examples, the void volume of one or more the respective layers 22 may be different than the void volume of other respective layers 22 that make up the total number of abradable layers 22.

CMAS resistant layers 20 may be less abradable than abradable layers 22 but may be more resistant to CMAS, e.g., to molten CMAS that may infiltrate coating system 18. In some examples, the composition of CMAS resistant layers 20 may be configured to react with molten CMAS to form stable products that slow the reaction/infiltration/penetration rate of CMAS, e.g., through the respective CMAS resistant layers 20. For example, the reaction product may be an apatite phase.

In some examples, CMAS resistant layers 20 may comprise, consist or consist essentially of GdZO, yttria stabilized zirconia, yttrium aluminate garnet(s) (YAG), YAlO—Yttrium Aluminate Garnets YAG, or some combination thereof. As one example, CMAS resistant layers 20 may comprise, consist or consist essentially of yttria stabilized zirconia with at least about 8 wt % yttria, such as about 20 wt % to about 55 wt % yttria, e.g., with a remainder being zirconia. As another example, CMAS resistant layers 20 may comprise, consist or consist essentially of Gd doped zirconia, with at least about 45 wt % Gd, such as about 45 wt % to about 78 wt % Gd, e.g., with a remainder being zirconia. The reaction product between GdZO and CMAS may be primarily an apatite phase based on $Gd_8Ca_2(SiO_4)$ $6O_2$. For YSZ, CMAS may penetrates the open structure of the coating as soon as melting occurs, whereupon the original 8YSZ dissolves in the CMAS and repreciptates with different morphology and composition that depends on the local melt chemistry. YAG may be less reactive to CMAS, and may form ($CaAl_2Si_2O_3$(Anorthite) and/or $Ca_4Y6O(SiO_4)_6$ (Calcium Yttrium Oxide Silicate).

Each respective layer of the plurality of CMAS resistant layers 20 in the alternating arrangement may have the same or substantially similar composition or, in other examples, the composition of one or more the respective layers 20 may be different than the composition of other respective layers 20 that make up the total number of CMAS resistant layers 20.

CMAS resistant layers 20 may have any suitable microstructure. In some examples, CMAS resistant layers 20 may be relatively dense (e.g., denser than the abradable layer) with a porosity of, e.g., less than about 10%, or less than about 5%. The microstructure may be the same or different than abradable layers 22. Each respective layer of the plurality of CMAS resistant layers 20 in the alternating arrangement may have the same microstructure or, in other examples, the microstructure of one or more the respective layers 20 may be different than the microstructure of other respective layers 20 that make up the total number of CMAS resistant layers 20.

CMAS resistant layers 20 may have any suitable porosity or other void volume. The porosity or other void volume of CMAS resistant layers 20 may contribute to the overall CMAS resistance of the layers 20. In some examples, CMAS resistant layers 20 may have a porosity or other void volume that is less than that of abradable layers 22. CMAS resistant layers 20 may include a porosity of, e.g., less than about 10 vol. %, such as less than about 8 vol. %, or less than about 5 vol. % or less than about 3 vol. %, where porosity is measured as a percentage of pore volume divided by total volume of CMAS resistant layers 22 (either on a individual layer basis or overall layer basis). In each case, the porosity of layers 20 may be measured using mercury porosimetry, optical microscopy or Archimedean method. In some examples, CMAS resistant layers 20 may include a void volume of, e.g., less than about 10 vol. %, such as less than about 8 vol. %, or less than about 5 vol. % or less than about 3 vol. %, where the void volume is the volume of void space over total volume. Each respective layer of the plurality of CMAS resistant layers 20 in the alternating arrangement may have the same or substantially similar void volume or, in other examples, the void volume of one or more the respective layers 20 may be different than the void volume of other respective layers 20 that make up the total number of CMAS resistant layers 20.

In some examples, the alternating layer arrangement of coating system 18 may improve the CMAS resistance. For example, the multiple interfaces formed between the alternating layers may prevent or slow down the propagation of thermal shock cracks (e.g., that originate at the interface of coating system 18 and underlying layer 14, 16 or substrate 12) through the coating system, to eliminate or reduce pathways through coating system 18 that CMAS may infiltrate. Thus, in addition to or as an alternatively to the relatively low porosity of layers 20 and/or reaction of layers 20 with CMAS to form a stable phase, the reduced crack propagation of coating system 18 may resist or arrest CMAS infiltration through the coating system and restrict CMAS effects to only an outer region of the coating system, thus more effectively protecting the underlying metallic substrate 12.

In some examples, the alternating coating structure described herein may help to manage the thermal stress due to thermal expansion mismatch between the dense GdZo layers (or other CMAS resistant layers) and the porous Mg Spinel layers (or other abradable layers). For example, since the CTE mismatch between the CMAS resistant layers and abradable layers may be relatively large, it may be better to have the CTE mismatch over a number of alternating layers/interfaces rather than only have two layers (one abradable and one CMAS resistant layer) in the coating system. In some examples, the CTE of Mg-Spinel is about 7-8 ppm/C, while that of GDZ may be about 11 ppm/C.

While the layers 20, 22 may be substantially planar, some or all of the layers 20, 22 may be made partially or completely non-planar as needed to conform to a shape of a CMC article. For example, one or more of the layers 20, 22 may deviate from planarity, and have any suitable shape or follow any suitable contour, such as planar, undulating, zig-zag, corrugated, or curved, or combinations thereof.

The respective discrete CMAS resistant layers 20 and respective discrete abradable layers 22 may have any suitable thickness. In some examples, the thickness of individual discrete CMAS resistant layers 20 may be about 0.001 inches to about 0.01 inches. In some examples, the thickness of individual discrete abradable layers 22 may be about 0.002 inches to about 0.006 inches. In some examples, the individual CMAS resistant layers 20 and individual abradable layers 22 may have the same thickness as each other or the thickness may differ. In some examples, each of the individual CMAS resistant layers 20 may have the same thickness throughout coating system 18 or it may vary between respective layers. In some examples, each of the individual abradable layers 22 may have the same thickness throughout coating system 18 or it may vary between respective layers. The overall total thickness of the abradable coating 18 may be about 0.02 inches to about 0.08 inches, such as about 0.03 inches to about 0.06 inches. In some examples, CMAS resistant layers 20 may have a layer thickness of about 1.5 mils (0.04 mm) and the abradable layers 22 have a layer thickness of about 2 mils (0.05 mm). In some examples, CMAS resistant layers 20 may have the minimum thickness required to provide continuous coverage over the underlying layer. The overall total thickness of the abradable coating 18 may be about 30 mils. Other values are contemplated.

In some examples, CMAS resistant layers 20 may be relatively thin to allow for a transfer of force from a mechanical interaction with, e.g., blade tip 38, to an underlying porous abradable layer 22 across the CMAS resistant layer 20. Such a force may allow for a respective CMAS resistant layer 20 to be "knocked off" or otherwise remove from coating system 18 when interacting with blade tip 38.

In various examples, the number of discrete layers 20, 22 in the coating system 18, as well as the arrangement of layers 20, 22, needed in a particular application may be determined by the penetration or rub depth of a blade or other rotating element contacting the coating system 18. For example, referring now to FIG. 3, article 110 includes metallic substrate 112, optional bond coat 114, and optional TBC layer 116. CMAS resistant abradable coating 118 resides on TBC layer 116, and includes an alternating arrangement of discrete CMAS resistant layers 120 and abradable layers 122. Substrate 112, bond coat 114, TBC layer 116, and coating system 118 may be substantially the same or similar to substrate 12, bond coat 14, TBC layer 16, and coating system 18 of FIGS. 1 and 2.

Figure 3:
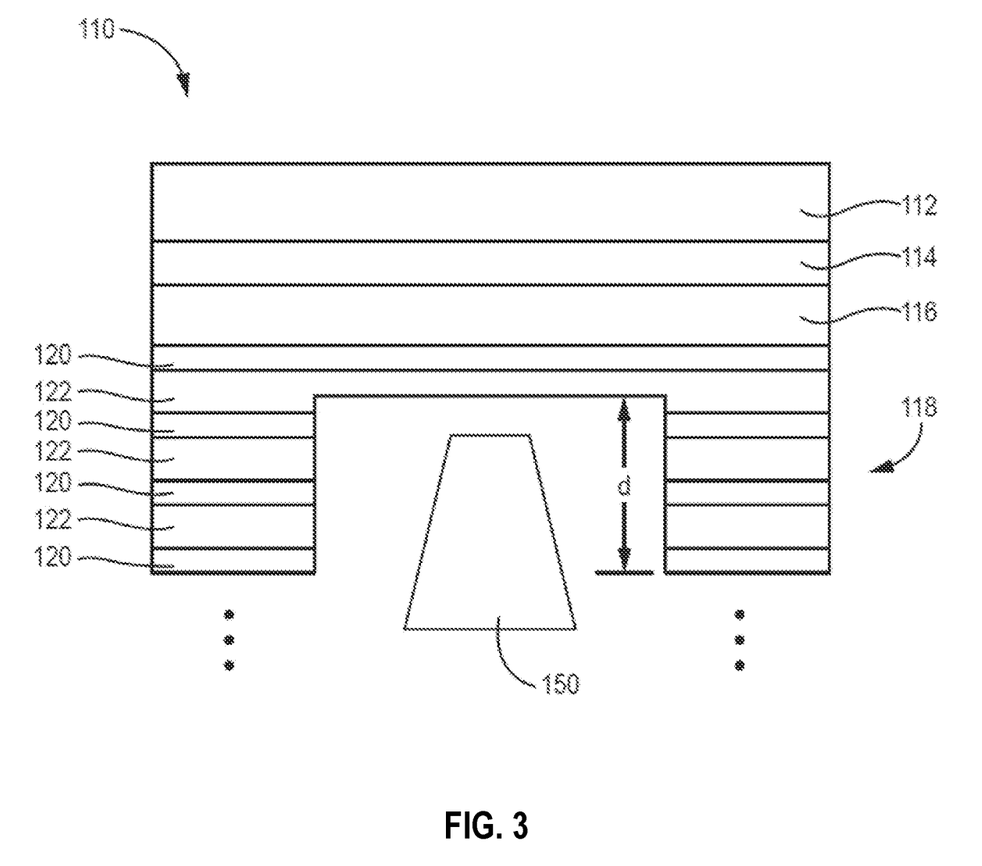
FIG. 3 is a schematic diagram of another example article including a layered abradable coating, which illustrates a cut made by an opposing rotating element.

As shown schematically in FIG. 3, a rotating element 150 (such as blade tip 38 of FIG. 1) makes a cut in the abradable coating system 118 with a maximum cut depth d. The CMAS resistant layer 120 closest to substrate 112 is positioned at a depth deeper than the maximum cut depth d of the rotating element 150, so that there is at least one undisturbed CMAS resistant layer 120 after the deepest cut made by the rotating element 150. The continuous and undisturbed CMAS resistant layer 120 may help to maintain CMAS resistance even after the deepest cut made by the rotating element 150 is made, e.g., during operation of a high temperature gas turbine engine.

Figure 4:
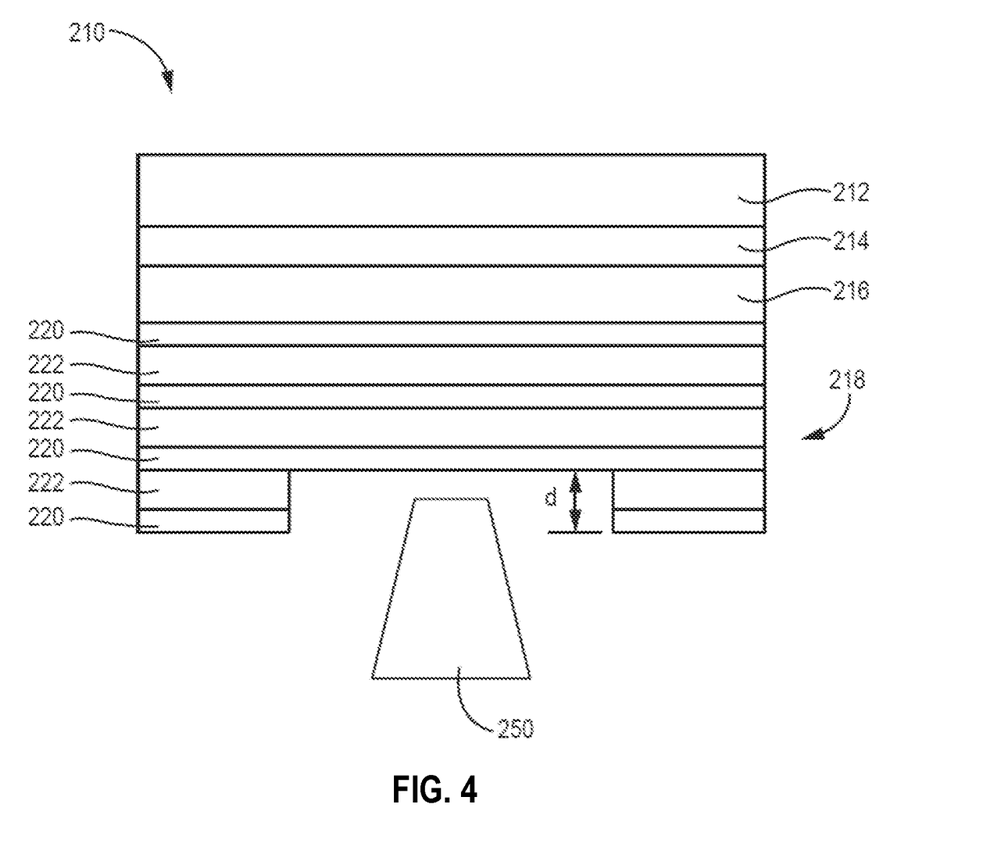
FIG. 4 is a perspective diagram illustrating an example article that includes an abradable coating and an EBC coating deposited on a substrate.

In another example shown schematically in FIG. 4, article 210 includes metallic substrate 212, optional bond coat 214, and TBC layer 216. CMAS resistant abradable coating system 218 resides on TBC layer 216, and includes an alternating arrangement of discrete CMAS resistant layers 220 and abradable layers 222, with a CMAS resistant layer 220 nearest CMC substrate 212 as well as another CMAS resistant layer 220 as the topcoat of coating system 218. Substrate 212, bond coat 214, TBC layer 216, and coating system 218 may be substantially the same or similar to substrate 12, bond coat 14, TBC layer 16, and coating system 18 of FIGS. 1 and 2.

As shown schematically in FIG. 4, a rotating element 250 makes a cut in coating system 218 with a maximum cut depth d. As in the example of FIG. 3, the CMAS resistant layer 220 that is closest to the CMC substrate 212 is positioned at a depth deeper than the maximum cut depth d of the rotating element 250, so that there is at least one undisturbed CMAS resistant layer 220 after the deepest cut made by the rotating element 250. As in FIG. 3, the continuous and undisturbed CMAS resistant layer 220 may help to maintain CMAS resistance. In the case of the relatively shallow blade cut depth of FIG. 4, the alternating layered structure of the coating system 218 is configured such that only a single CMAS resistant layer 220 and a single abradable layer 222 are abraded, e.g., during operation of a high temperature gas turbine engine. The alternating layer arrangement of coating system 18 may help manage the thermal stress due to thermal expansion mismatch between the relatively dense CMAS resistant layer 220 and relatively porous abradable layers 222, e.g., which may be particularly beneficial in examples such as that shown in FIG. 4 where the cut depth d into coating system 18 is relatively shallow.

Referring again to FIG. 2, the layers of article 10 may be formed by wide variety of techniques. For example, the optional bond coat 14 may be formed on metallic substrate 12 by vapor deposition, spraying, and the like. TBC layer 16 and the layers 20, 22 of the abradable coating system 18 may be formed by one or more of vapor deposition, slurry deposition, electrophoretic deposition, or thermal spraying, for example, air plasma spray, low pressure plasma spray, suspension plasma spray, or high velocity oxy-fuel (HVOF) spraying. One or more parameters of the deposition process may be tailored to achieve layers having the properties (e.g., composition, microstructure, void volume) described herein.

In some examples, the alternating layer arrangement of coating system 18 may be achieved by switching between two powder feeds and/or spray parameter that are suitable for each of CMAS resistant layers 20 and abradable layers 22 during a thermal spray process.

In some examples, the porosity or other void volume of CMAS resistant layers 20 and abradable layers 22 may be controlled by the use of coating material additives and/or processing techniques to create the desired void volume. For example, to form abradable layers 20 of coating system 18 in FIG. 2, a fugitive material that melts or burns at the use temperatures of the component (e.g., a blade track) may be incorporated into the coating material that forms abradable layers 22. The fugitive material may include, for example, graphite, hexagonal boron nitride, or a polymer such as a polyester, and may be incorporated into the coating material prior to deposition of the coating material on substrate 12 to form abradable layers 22. The fugitive material then may be melted or burned off in a post-formation heat treatment, or during operation of the gas turbine engine, to form pores in layers 22.

In another example for forming the various layers on substrate 12, a slurry may be deposited using painting, dip coating, spraying, or the like, followed by drying and sintering. The slurry particles may include the desired composition of the final coating, or may include precursors that react during the sintering process to form the coating with a desired composition and other properties.

In another examples, the layers 20, 22 may be formed by a surface reaction or sol-gel infiltration.

Various examples have been described. These and other examples are within the scope of the following clauses and claims.

Clause 1: An article comprising a metallic substrate; and an abradable coating on the metallic substrate, the abradable coating comprising a plurality of abradable layers in an alternating arrangement with a plurality of CMAS resistant layers, wherein the plurality of CMAS resistant layers are configured to react with molten CMAS to form a stable phase.

Clause 2. The article of clause 1, wherein the plurality of abradable layers comprise a magnesium (Mg) spinel.

Clause 3. The article of clauses 1 or 2, wherein the plurality of CMAS resistant layers comprises at least one of gadolinium zirconate (GdZO), yttria stabilized zirconia with greater than 8 wt. % yttria, or a yttrium aluminate garnet.

Clause 4. The article of any one of clauses 1 to 3, wherein the plurality of CMAS resistant layers comprises yttria stabilized zirconia having great than 8 wt. % yttria with a remainder being zirconia.

Clause 5. The article of any one of clauses 1 to 4, wherein the plurality of abradable layers have a higher porosity than the plurality of CMAS resistant layers.

Clause 6. The article of any one of clauses 1 to 5, wherein the plurality of abradable layers have a greater thickness than the plurality of CMAS resistant layers.

Clause 7. The article of any one of clauses 1 to 6, further comprising a bond coat on the substrate, wherein the abradable coating is on the bond coat.

Clause 8. The article of any one of clauses 1 to 7, wherein a respective layer of the plurality of CMAS resistant layers define an outermost topcoat of the abradable coating.

Clause 9. The article of any one of clauses 1 to 8, wherein a respective layer of the plurality of abradable layers is nearest to the metallic substrate of the abradable coating.

Clause 10. An abradable system comprising a metallic substrate; an abradable coating on the metallic substrate, the abradable coating comprising a plurality of abradable layers in an alternating arrangement with a plurality of CMAS resistant layers, wherein the plurality of CMAS resistant layers are configured to react with molten CMAS to form a stable phase; and an opposing abrasive element acting on the abradable coating, Clause 11. The system of clause 10, wherein the abrasive element is configured to abrade the abradable coating to a maximum penetration depth in the abradable coating, and wherein the abradable coating comprises at least one respective CMAS resistant layer of the plurality of CMAS resistant layers between the maximum penetration depth and the metallic substrate.

Clause 12. The system of clause 10, wherein the plurality of abradable layers comprise a magnesium (Mg) spinel.

Clause 13. The system of clauses 10 or 12, wherein the plurality of CMAS resistant layers comprises at least one of gadolinium zirconate (GdZO), yttria stabilized zirconia with greater than 8 wt. % yttria, or a yttrium aluminate garnet.

Clause 14. The system of any one of clauses 10 to 13, wherein the plurality of CMAS resistant layers comprises yttria stabilized zirconia having great than 8 wt. % yttria with a remainder being zirconia.

Clause 15. The system of any one of clauses 10 to 14, wherein the plurality of abradable layers have a higher porosity than the plurality of CMAS resistant layers.

Clause 16. The system of any one of clauses 10 to 15, wherein the plurality of abradable layers have a greater thickness than the plurality of CMAS resistant layers.

Clause 17. The system of any one of clauses 10 to 16, further comprising a bond coat on the substrate, wherein the abradable coating is on the bond coat.

Clause 18. The system of any one of clauses 10 to 17, wherein a respective layer of the plurality of CMAS resistant layers define an outermost topcoat of the abradable coating.

Clause 19. The system of any one of clauses 10 to 18, wherein a respective layer of the plurality of abradable layers is nearest to the metallic substrate of the abradable coating.

Clause 20. A method comprising forming an abradable coting on a metallic substrate, the abradable coating comprising a plurality of abradable layers in an alternating arrangement with a plurality of CMAS resistant layers, wherein the plurality of CMAS resistant layers are configured to react with molten CMAS to form a stable phase.

Clause 21: A method comprising forming any one of the articles or systems of clauses 1-19.

What is claimed is:

1. An abradable system comprising:
a metallic substrate;
an abradable coating on the metallic substrate, the abradable coating comprising a plurality of abradable layers in an alternating arrangement with a plurality of CMAS resistant layers, wherein the plurality of CMAS resistant layers are configured to react with molten CMAS to form a stable phase; and
an opposing abrasive element acting on the abradable coating,
wherein the abrasive element is configured to abrade the abradable coating to a maximum penetration depth in the abradable coating, and wherein the abradable coating comprises at least one respective CMAS resistant layer of the plurality of CMAS resistant layers between the maximum penetration depth and the metallic substrate.

2. The system of claim 1, wherein the plurality of abradable layers comprise a magnesium (Mg) spinel.

3. The system of claim 1, wherein the plurality of CMAS resistant layers comprises at least one of gadolinium zirconate (GdZO), yttria stabilized zirconia with greater than 8 wt. % yttria, or a yttrium aluminate garnet.

4. The system of claim 1, wherein the plurality of CMAS resistant layers comprises yttria stabilized zirconia having great than 8 wt. % yttria with a remainder being zirconia.

5. The system of claim 1, wherein the plurality of abradable layers have a higher porosity than the plurality of CMAS resistant layers.

6. The system of claim 1, wherein the plurality of abradable layers have a greater thickness than the plurality of CMAS resistant layers.

7. The system of claim 1, further comprising a bond coat on the substrate, wherein the abradable coating is on the bond coat.

8. The system of claim 1, wherein a respective layer of the plurality of CMAS resistant layers define an outermost topcoat of the abradable coating.

9. The system of claim 1, wherein a respective layer of the plurality of abradable layers is nearest to the metallic substrate of the abradable coating.

10. A method comprising:
forming an abradable coating on a metallic substrate, the abradable coating comprising a plurality of abradable layers in an alternating arrangement with a plurality of CMAS resistant layers, wherein the plurality of CMAS resistant layers are configured to react with molten CMAS to form a stable phase; and
abrading the abradable coating with an opposing abrasive element acting on the abradable coating, wherein the abrasive element is configured to abrade the abradable coating to a maximum penetration depth in the abradable coating, and wherein the abradable coating comprises at least one respective CMAS resistant layer of the plurality of CMAS resistant layers between the maximum penetration depth and the metallic substrate.

* * * * *